United States Patent [19]

Yamagishi et al.

[11] Patent Number: 4,926,230

[45] Date of Patent: May 15, 1990

[54] MULTIPLE JUNCTION SOLAR POWER GENERATION CELLS

[75] Inventors: Hideo Yamagishi; Minori Yamaguchi; Keizo Asaoka; Akihiko Hiroe; Masataka Kondo; Kazunori Tsuge; Yoshihisa Tawada, all of Hyogo, Japan

[73] Assignee: Kanegafuchi Kagaku Kogyo Kabushiki Kaisha, Osaka, Japan

[21] Appl. No.: 377,745

[22] Filed: Jul. 10, 1989

Related U.S. Application Data

[63] Continuation of Ser. No. 33,476, Apr. 2, 1987, abandoned.

[30] Foreign Application Priority Data

Apr. 4, 1986 [JP] Japan .................................. 61-78598

[51] Int. Cl.$^5$ .............................................. H01L 27/14
[52] U.S. Cl. .................................... 357/30; 357/90; 357/58; 357/2; 357/63; 136/249
[58] Field of Search ............... 357/30 F, 30 J, 58, 357/90, 2, 63, 30 K, 30 P, 30 L; 136/249

[56] References Cited

U.S. PATENT DOCUMENTS

| | | | |
|---|---|---|---|
| 4,171,235 | 10/1979 | Fraas et al. | 357/30 J X |
| 4,249,957 | 2/1981 | Koliwad et al. | 357/30 K X |
| 4,255,211 | 3/1981 | Fraas | 357/30 J X |
| 4,332,974 | 6/1982 | Fraas | 357/30 J X |
| 4,377,723 | 3/1983 | Dalal | 357/30 J X |
| 4,404,421 | 9/1983 | Fraas | 357/30 J X |
| 4,460,670 | 7/1984 | Ogawa et al. | 357/30 K X |
| 4,492,810 | 1/1985 | Ovshinsky et al. | 357/30 K X |
| 4,703,553 | 11/1987 | Mardesich | 357/30 J X |
| 4,721,535 | 1/1988 | Itoh et al. | 357/30 K X |
| 4,737,196 | 4/1988 | Yukimoto | 357/30 J X |
| 4,742,012 | 5/1988 | Matsumura et al. | 357/30 K X |
| 4,776,894 | 10/1988 | Watanabe et al. | 357/30 K X |

FOREIGN PATENT DOCUMENTS 58-163954  9/1983  Japan .................................. 357/30 K

OTHER PUBLICATIONS

Bedair et al., "AlGaAs/GaAs High Efficiency Cascade Solar Cells", *15th IEEE Photovoltaic Conference—1981*, May 12-15, 1981, pp. 21-26.

*Primary Examiner*—William Mintel
*Attorney, Agent, or Firm*—Cushman, Darby & Cushman

[57] ABSTRACT

A photovoltaic device of amorphous or microcrystalline semiconductor having multijunction wherein one or more layer including high concentration impurities is interposed between p-type conductive layer and n-type conductive layer. A tunnel junction is formed by the interposed layer to elevate the photo-electric conversion rate.

9 Claims, 1 Drawing Sheet

FIGURE
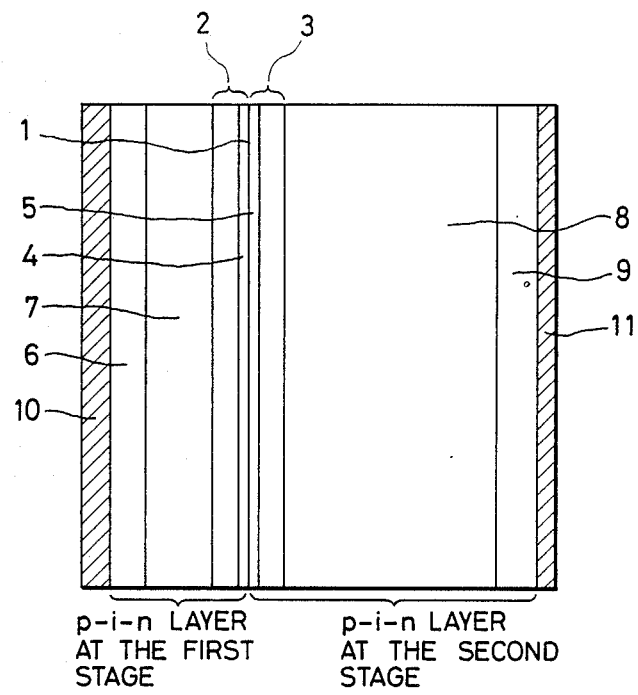

MULTIPLE JUNCTION SOLAR POWER GENERATION CELLS

This is a continuation of application Ser. No. 07/033,476, filed April 2, 1987, which was abandoned upon the filing hereof.

BACKGROUND OF THE INVENTION

1. Field of the Invention

The present invention relates to the field of amorphous silicon or amorphous alloy multiple junction solar power generation cells.

2. Description of the Prior Art

In prior art multiple junction solar power generation cells, photogenerated carriers in a first layer of semiconductor material are recombined with electrons or holes that exist at a p-n interface between the first layer and a second layer of semiconductor material, thus generating an electric current between the layers. However, a disadvantage in such devices was that some of the carriers displaced from the first layer failed to find electrons or holes at the p-n interface and penetrated the second layer. In addition, many of the carriers in the second layer migrated across the p-n interface into the first layer, thereby resulting in a lowering of the overall efficiency of the device. A need exists in the prior art for a semiconductor device that is free of the abovementioned problems.

SUMMARY OF THE INVENTION

An object of the present invention is to provide an amorphous silicon multiple junction solar power generation cell that has an efficiency higher than that of a conventional cell of the same type.

Accordingly, the present invention is a semiconductor device of an amorphous and/or microcrystalline (hereinafter referred to as "amorphous") structure with laminated p-i-n or n-i-p type photovoltaic elements that are provided with high impurity concentration layers, wherein the impurity concentration has been increased to an extent that is sufficient to promote the recombination of carriers on the n-p or p-n interface of the device.

Other objects, features, and characteristics of the present invention, as well as the methods and operations and functions of the related elements of the structure, and to the combination of parts and economies of manufacture, will become apparent upon consideration of the following description and the appended claims with reference to the accompanying drawings, all of which form a part of this specification, wherein like reference numerals designate corresponding parts in the various figures.

BRIEF DESCRIPTION OF THE DRAWING

The lone FIGURE depicts the preferred embodiment of the present invention.

DETAILED DESCRIPTION OF THE PREFERRED EMBODIMENT

As shown in the drawing, an amorphous semiconductor device is provided that may be used as a photovoltaic cell. The semiconductor device in the illustrated embodiment is formed of a pair of outer electrodes 10, 11, a p-layer 6 that is adjacent the electrode 10, an i-layer 7 adjacent to the p-layer 6 and an n-layer 2 adjacent the i-layer 7. An additional n-layer 9 is provided adjacent the second electrode 11, and an interface i-layer 8 is provided adjacent n-layer 9. A p-layer 3 is provided adjacent the i-layer 8 and forms a p-n interface with the n-layer 2. The various layers are constructed of known materials, such as silicon, silicon carbide, silicon nitride, silicon germanium, silicon tin, or a mixture thereof and have thicknesses on the order of those commonly found in photovoltaic elements.

One novel and advantageous feature of the present invention is that there are provided high impurity concentration layers (4,5) on the n-p or p-n interface portion of the multiple junction photovoltaic elements, as is shown in the drawing. The impurities in these layers have been increased to an extent that is sufficient to promote the recombination of free electrons with the electron holes near the interface.

The interface 1 between the n-layer 2 and the p-layer 3 can be the boundary between the two layers, as is shown in the drawing, or a newly provided layer between the layers p and n of the n-p or p-n interface. If the interface is a newly provided layer, it preferably contains N, O, Fe, Cu and Ge metals other than the p- or n-type dopant, or a combination thereof.

The preferred thickness of the n-p or p-n interface portion between the p-layer 3 and n-layer 2 depends on the impurities and concentration thereof in those layers, but should preferably be greater than 10 Å in view of present film-forming techniques. The thickness of the p-layer or the n-layer is preferably about 70–700 Å. When the p-layer is provided, with an impurity concentration layer, it is preferable to use a p-type dopant such as Boron to form such a layer of a thickness within the range of 10–300 Å. When the n-layer is provided with an impurity concentration layer, it is preferable to use an n-type dopant such as phosphorous and to form the thickness of the layer within the range of about 10–500 Å. The thicker the high impurity concentration layer, the greater the light absorption loss becomes.

On the other hand, in the embodiment wherein an additional p-n interface layer is added, the interface layer should preferably be roughly 10–300 Å thick and more preferably be 30–150 Å thick.

By increasing the impurity concentration to an extent sufficient to promote the recombination of the carriers, an electron which is generated by light falling on a first semiconductor layer is more efficiently recombined with a hole produced at a second semiconductor layer on the p-n interface in the case of p-i-n type photovoltaic element. In other words, the I-V curve on the n-p or p-n interface should be made as straight as possible.

The preferred impurity concentration depends on the type of impurity that has been introduced and on the thickness of the high impurity concentration layer, and therefore its range cannot be defined unconditionally. When a p- or n-type dopant is used as an impurity, the dopant concentration should be more than twice as high as and preferably 3–10 times its concentration in the p or n layer adjacent to the i layers 7, 8. In that case, the concentration should preferably be 0.01–3 atm % and more preferably be 0.05–2 atm %.

When there is provided between the p- and n- layers a high impurity concentration layer, for example Cu, Fe, O, N or Ge doped layer, the concentration of the impurity other than the p- or n-type dopant roughly ranges from 0.01 to 3 atm % for Cu and Fe and from 1 to 10 atm % for O, N and Ge.

The provision of the high impurity concentration layer on the n-p or p-n interface portion increases the level in the gap (localized level concentration) by more than one order, promotes the recombination of carriers and improves photo-conversion efficiency.

Referring now to the examples, the semiconductor devices that have been constructed according to the present invention will now be described.

EXAMPLE 1.

Semiconductor layers were formed into a solar cell using a coupling glow discharge apparatus having a parallel plate capacity. The cell had an effective area of 1.0 cm² and had a glass substrate/SnO₂ electrode/p-layer having a thickness of 150 Å; an i-layer having a thickness of 600 Å; an n-layer having a thickness of 300 Å; an n-type high impurity concentration layer having a thickness of 100 Å; a p-type high impurity concentration layer having a thickness of 100 Å; a p-layer having a thickness of 150 Å; an i-layer of 5000 Å; an n-layer of 500 Å; and an Aluminum electrode. An AM-1, 100 mW/cm² solar simulator was used to evaluate the performance. The results obtained were n=8.5%, Voc=1.75 volts, Jsc=6,84 mA/cm², FF=71%.

The layers have the following conditions:
p-layer: SiH₄, 20 sccm, B₂H₆ (diluted with H₂ to 1000 ppm) 50 sccm, 10 mW/cm², 1.0 Torr.
i-layer: SiH₄, 30 sccm, 10 mWg/cm², 0.5 Torr.
n-layer: SiH₄, 20 sccm, PH₃ (diluted with H₂ to 1000 ppm) 100 sccm, 10 mW/cm², 0.5 Torr.
p-type high impurity concentration layer: SiH₄, 20 sccm, B₂H₆ (diluted with H₂ to 1000 ppm), 100 sccm, 10 mw/cm² 1.0 Torr.
n-type high impurity concentration layer: SiH₄, 20 sccm, PH₃ (diluted with H₂ to 1000 ppm) 300 sccm, 10 mW/cm², 0.5 Torr.

EXAMPLE 2

Semiconductor layers were formed in the same manner as Example 1 into a solar cell having an effective area of 1.0 cm² with a glass substrate/SnO₂ electrode/p-layer (thickness 150 Å);i-layer (thickness 600 Å)an n-layer (thickness 300 Å)an n-type high impurity concentration layer (thickness 100 Å)a p-type high impurity concentration layer (thickness 100 Å)a p-layer (thickness 150 Å); an i-layer (thickness 5000 Å);and an n-layer (thickness 500 Å)having an aluminum electrode attached thereto. The AM-1, 100 mW/cm² solar simulator was used to evaluate the performance. The results obtained were U=7.0%, Voc=1.59 volts, Jsc=7.22 mA/cm², FF=61%.

The high impurity concentration layer was formed by adding N₂ 500 sccm under the same conditions of forming the p-layer of Example 1.

COMPARATIVE EXAMPLE 1

Semiconductor layers were formed in the same manner as Example 1 into a solar battery except that the n- and p-type high impurity concentration layers of Example 1 were not provided and evaluated in the same manner as Example 1. The results obtained were U=6.2%, Voc=1.49 volts, Jsc=7.17 mA/cm², FF=58%.

From the above examples, it is clear that the performance of a solar cell in terms of Jsc, Voc and FF can be improved by providing a multiple unction solar cell according to the present invention with high impurity concentration layers on the p-n or n-p interface.

While the invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed:

1. A semiconductor device substantially consisting of amorphous material, having a multijunction structure comprising:
    a first electrode;
    a first layer comprised of a plurality of layers that are P-type, intrinsic, and N-type to form a first P-I-N photovoltaic element having a first surface of one conductivity type adjacent said first electrode and a second surface;
    a second layer comprised of a plurality of layers that are P-type, intrinsic, and N-type toから a second P-I-N photovoltaic element having a first surface of an opposite conductivity type and a second surface;
    a semiconductor high impurity layer, having a higher impurity doping than either of said first and second p-I-N photovoltaic elements, said high impurity layer being disposed between said second surface of said first P-I-N element and said first surface of said second P-I-N element; and
    a second electrode adjacent said second surface of said second P-I-N element.

2. The semiconductor device of claim 1 wherein said high impurity layer is disposed on said second p-i-n photovoltaic element.

3. The semiconductor device of claim 2, wherein said high impurity layer has a thickness within the range of 10–300 Å.

4. The semiconductor device of claim 2, wherein said high impurity layer is doped with dopants consisting essentially of p-type dopants.

5. The semiconductor device of claim 1 wherein said high impurity layer is disposed on said first p-i-n photovoltaic element.

6. The semiconductor device of claim 5, wherein said high impurity layer is doped with dopants consisting essentially of n-type dopants.

7. The semiconductor device of claim 5, wherein said high impurity layer has a thickness within the range of 10–700 Å.

8. The semiconductor device of claim 1, wherein said high impurity layer comprises at least two layers.

9. A photovoltaic device comprising:
    a first electrode;
    a first layer comprised of a plurality of layers that are P-type, intrinsic, and N-type to form a first P-I-N photovoltaic element having an amorphous crystalline structure and having a first surface of a first conductivity type and a second surface, said first surface being adjacent to said first electrode;
    a second layer comprised of a plurality of layers that are P-type, intrinsic, and N-type to form a second P-I-N photovoltaic element having an amorphous crystalline structure and having a first surface of an opposite conductivity type and a second surface;
    a semiconductor boundary layer disposed between said first P-I-N photovoltaic element and said second P-I-N element, said boundary layer having an impurity concentration higher than the impurity concentration of either of said first and second P-I-N photovoltaic elements, said impurities being selected from the group consisting of nitrogen, oxygen, iron, copper and germanium; and
    a second electrode adjacent said second surface of said second P-I-N element.

* * * * *